(12) United States Patent
Chou

(10) Patent No.: US 7,358,780 B2
(45) Date of Patent: Apr. 15, 2008

(54) LOW VOLTAGE DIFFERENTIAL SIGNAL DRIVER WITH HIGH POWER SUPPLY REJECTION RATION

(75) Inventor: Min-Chung Chou, Miao Li County (TW)

(73) Assignee: Sunplus Technology Co., Ltd., Hsin-Chu (TW)

( * ) Notice: Subject to any disclaimer, the term of this patent is extended or adjusted under 35 U.S.C. 154(b) by 171 days.

(21) Appl. No.: 11/287,396

(22) Filed: Nov. 28, 2005

(65) Prior Publication Data
US 2006/0125532 A1 Jun. 15, 2006

(30) Foreign Application Priority Data
Dec. 15, 2004 (TW) .............................. 93138986 A

(51) Int. Cl.
*H03B 1/00* (2006.01)
*H03K 3/00* (2006.01)

(52) U.S. Cl. .................... 327/112; 326/82; 326/83; 326/86; 326/87

(58) Field of Classification Search .................. None
See application file for complete search history.

(56) References Cited
U.S. PATENT DOCUMENTS 6,356,141 B1 * 3/2002 Yamauchi ............... 327/543
6,639,434 B1 * 10/2003 Rahman .................. 327/108
7,071,739 B1 * 7/2006 Duzevik et al. .......... 327/108
7,215,148 B1 * 5/2007 Johnson et al. ........... 326/83
2006/0006912 A1 * 1/2006 Leonowich et al. ....... 327/112

* cited by examiner

*Primary Examiner*—Tuan T Lam
(74) *Attorney, Agent, or Firm*—Muncy, Geissler, Olds & Lowe, PLLC

(57) ABSTRACT

A LVDS (Low Voltage Differential Signal) driver with a high PSRR (Power Supply Rejection Ration) includes a first current source for providing a working current, a switch unit for receiving the working current and determining the current directions of an output current at first and second signal nodes according to first and second input signals, a second current source connected between the switch unit and a low working power voltage, a common mode feedback unit for generating a common mode control signal according to voltages on the first and second signal nodes of the switch unit, a common mode resistance unit connected in parallel with the second current source and having a resistance value controlled by the common mode control signal, and a compensation unit connected in parallel with the second current source for compensating the current variation of the first current source caused by power noise.

8 Claims, 4 Drawing Sheets

LOW VOLTAGE DIFFERENTIAL SIGNAL DRIVER WITH HIGH POWER SUPPLY REJECTION RATION

This application claims the benefit of the filing date of Taiwan Application Ser. No. 093138986, filed on Dec. 15, 2004, the content of which is incorporated herein by reference.

BACKGROUND OF THE INVENTION

1. Field of the Invention

The invention relates to a LVDS (Low Voltage Differential Signal) driver, and more particularly to a LVDS driver with a high PSRR (Power Supply Rejection Ration).

2. Description of the Related Art

FIG. 1 shows the architecture of a conventional LVDS (Low Voltage Differential Signal) driver. The LVDS driver may be used in the data transmission of a LCD (Liquid Crystal Display). Because the voltage amplitude of the LVDS driver is smaller, the transmission speed may be faster. As shown in FIG. 1, the LVDS driver 11 includes current sources CS1 and CS2, a switch unit 111, a common mode feedback unit 112 and a transistor MNR (common mode resistance unit). The currents of the current sources CS1 and CS2 are defined as $I_1$ and $I_2$. The switch unit 111 includes transistors MP1, MP2, MN1 and MN2. The transistors MP1, MP2, MN1 and MN2 of the switch unit 111, which are controlled by input signals IN and INB, determine the current direction of the output current Iout. That is, when the input signal IN is a high logic level and the input signal INB is a low logic level, the transistors MP2 and MN1 are ON and the transistors MP1 and MN2 are OFF. Thus, the output current Iout is positive. At this time, a resistor R1 of a receiver 12 receives the positive signal. When the input signal IN is the low logic level and the input signal INB is the high logic level, the transistors MP2 and MN1 are OFF and the transistors MP1 and MN2 are ON. Thus, the output current Iout is negative. At this time, the resistor R1 of the receiver 12 receives the negative signal. The receiver 12 includes the resistor R1 and a receiving unit 121.

In addition, the LVDS driver 11 further includes a common mode feedback (CMFB) unit 112 and the transistor MNR, which serves as a resistor to adjust the common mode voltage for transmission data. If the resistance value of the transistor MNR is Rc, then the voltage Va at the node a is:

$$Va = I*Rc,$$

wherein I is the difference of the current between the current source CS1 and the current source CS2, i.e., $I=I_1-I_2$. If the resistance value of the impedance matched resistor R1 of the receiver 12 is 100 Ohms ($\Omega$), then the common mode voltage for transmission data is $(Va+I_1*100/2)$. In the architecture of FIG. 1, the current source CS1 plays an important role in the PSRR (Power Supply Rejection Ration). The ideal current source CS1 has a best PSRR. In other words, because the current source CS1 has the non-ideal characteristic, the power noise influences the common mode level for transmission data. The influence can be induced by the parasitic capacitance and the channel length modulation (Vds*$\lambda$). From the viewpoint of the influence of the channel length modulation, the current variation $\Delta I_1$ of the current source CS1 is in direct proportion to the power voltage variation (noise) $\Delta VDD$, i.e., $$\Delta I_1 = \Delta VDD * K1 \quad (1).$$

Similarly, owing to the influence of the channel length modulation, $\Delta Va$ is in direct proportion to $\Delta I_1$, so $\Delta Va$ is also in direct proportion to $\Delta VDD$, i.e., $$\Delta Va = \Delta VDD * K2 \quad (2).$$

Thus, the voltage Va at the node a is influenced by the power voltage VDD such that the common mode level is also influenced by the power voltage VDD.

Of course, some prior arts may be adopted to improve the characteristic of the current source CS1. For example, a cascode current source or a current source with a longer channel may be used. However, the voltage headroom of the cascode current source is restricted in the deep submicron technology, while using the current source with a longer channel requires a larger chip area and includes some limitations. Of course, the common mode feedback unit can correct the influence of the power noise, but the correction cannot be made in real time and is restricted by the bandwidth of the common mode feedback unit.

SUMMARY OF THE INVENTION

It is therefore an object of the invention to provide a LVDS (Low Voltage Differential Signal) driver with a high PSRR (Power Supply Rejection Ration) by using a compensation unit to eliminate the power noise.

To achieve the above-mentioned object, the invention provides a LVDS (Low Voltage Differential Signal) driver with a high PSRR (Power Supply Rejection Ration). The LVDS driver includes a first current source, a switch unit, a second current source, a common mode feedback unit, a common mode resistance unit and a compensation unit. The first current source provides a working current. The switch unit receives the working current and determines the output current directions of an output current at first and second signal nodes according to first and second input signals. The second current source is connected between the switch unit and a low working power voltage. The common mode feedback unit generates a common mode control signal according to the voltages on the first signal node and the second signal node of the switch unit. The common mode resistance unit is connected in parallel with the second current source and has a resistance value controlled by the common mode control signal. The compensation unit, which is connected in parallel with the second current source, compensates the current variation of the first current source caused by the power noise.

Thus, the current variation of the first current source caused by the power noise may flow to the low operation voltage through the compensation unit without flowing through the common mode resistance unit and thus influencing the common mode level.

DETAILED DESCRIPTION OF THE INVENTION

The LVDS (Low Voltage Differential Signal) driver having a high PSRR (Power Supply Rejection Ration) according to the invention will be described with reference to the accompanying drawings.

Figure 1:
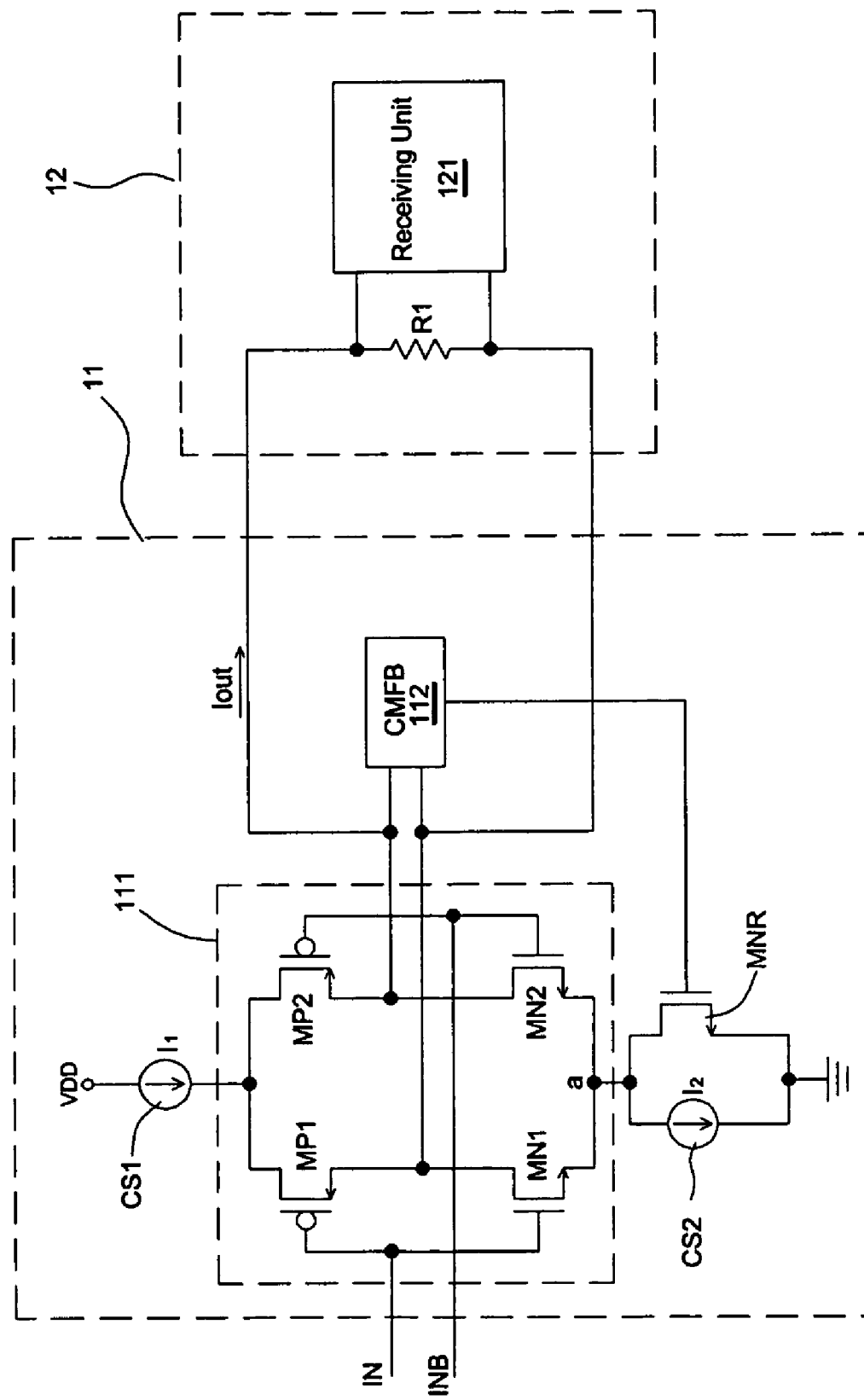
FIG. 1 shows the architecture of a conventional LVDS driver.
Figure 2:
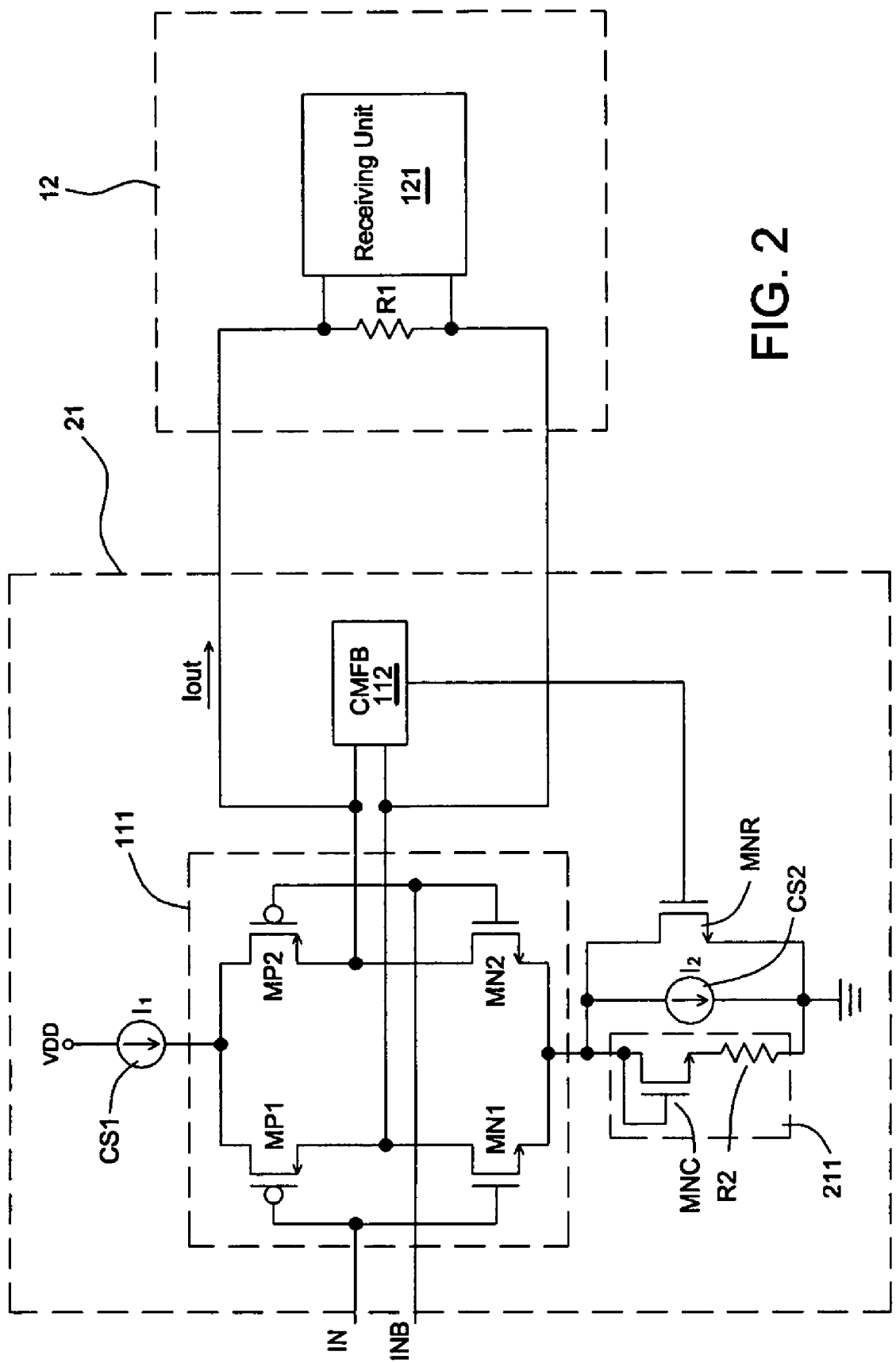
FIG. 2 shows the architecture of a LVDS driver with a high PSRR according to a first embodiment of the invention.

FIG. 2 shows the architecture of a LVDS driver with a high PSRR according to a first embodiment of the invention. As shown in FIG. 2, the LVDS driver 21 with the high PSRR according to this embodiment of the invention includes current sources CS1 and CS2, a switch unit 111, a common mode feedback unit 112, a common mode feedback resistance (transistor MNR), and a compensation unit 211 for eliminating the influence of the power noise on the common mode level. The switch unit 111 includes transistors MP1, MP2, MN1 and MN2. The compensation unit 211, which is connected in parallel with the current source CS2, compensates the current variation of the current source CS1 caused by the power voltage variation. The compensation unit 211 of this embodiment includes a transistor MNC and a resistor R2. The architectures and functions of the current sources CS1 and CS2, the switch unit 111, the common mode feedback unit 112 and the transistor MNR of this embodiment are the same as those of the prior art, and detailed descriptions thereof will be omitted.

The principle of the compensation unit 211 for compensating the current variation of the current source CS1 caused by the power voltage variation will be described in the following. First, the relationships between $\Delta I_1$, $\Delta Va$ and $\Delta VDD$ may be obtained according to Equation (1) of ($\Delta I_1 = \Delta VDD*K1$) and Equation (2) of ($\Delta Va = \Delta VDD*K2$). Next, the current flowing through the transistor MNC of the compensation unit 211 is defined as Ic. Thus, $\Delta Ic$ is in direct proportion to $\Delta Va$, i.e., $$\Delta Ic = \Delta Va * K3 \quad (3).$$

Substituting Equation (2) of $\Delta Va = \Delta VDD*K2$ into Equation (3) can obtain the relationship between $\Delta Ic$ and $\Delta VDD$, i.e., $$\Delta Ic = \Delta VDD * K2 * K3 \quad (4).$$

Thus, comparing Equation (1) with Equation (4) can obtain that $\Delta Ic$ may equal $\Delta I_1$ as long as $K1=K2*K3$. Thus, $\Delta I_1$ of the current source CS1 caused by the power noise may flow to a second operation voltage (ground) VSS through the compensation unit 211 without flowing through the transistor MNR to avoid the influence of the common mode level.

Figure 3:
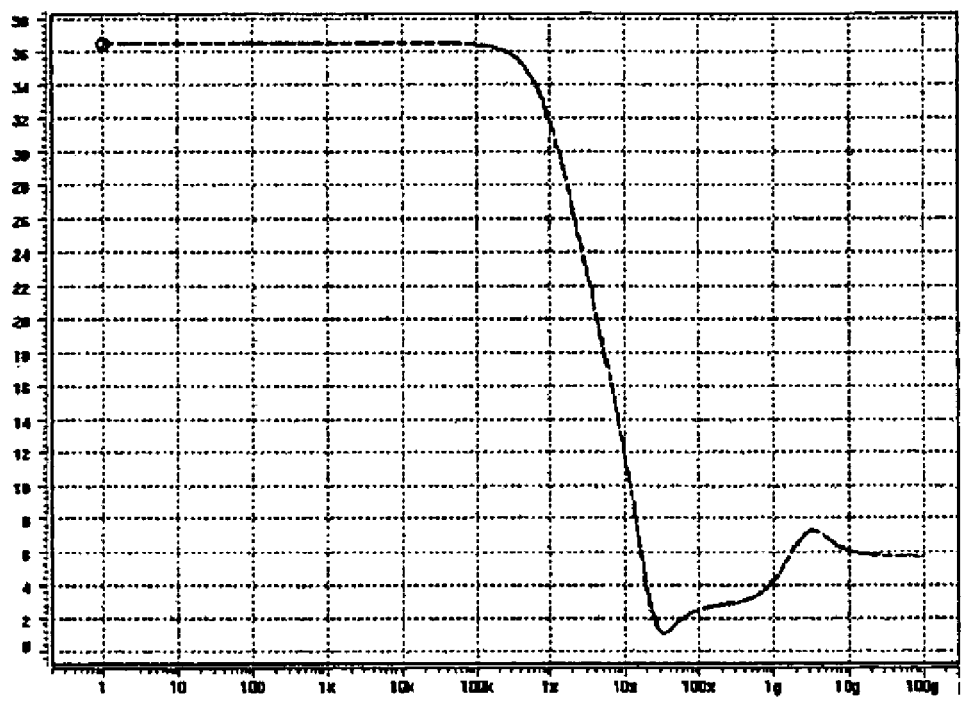
FIG. 3 shows a simulation result of PSRR in the conventional LVDS driver.
Figure 4:
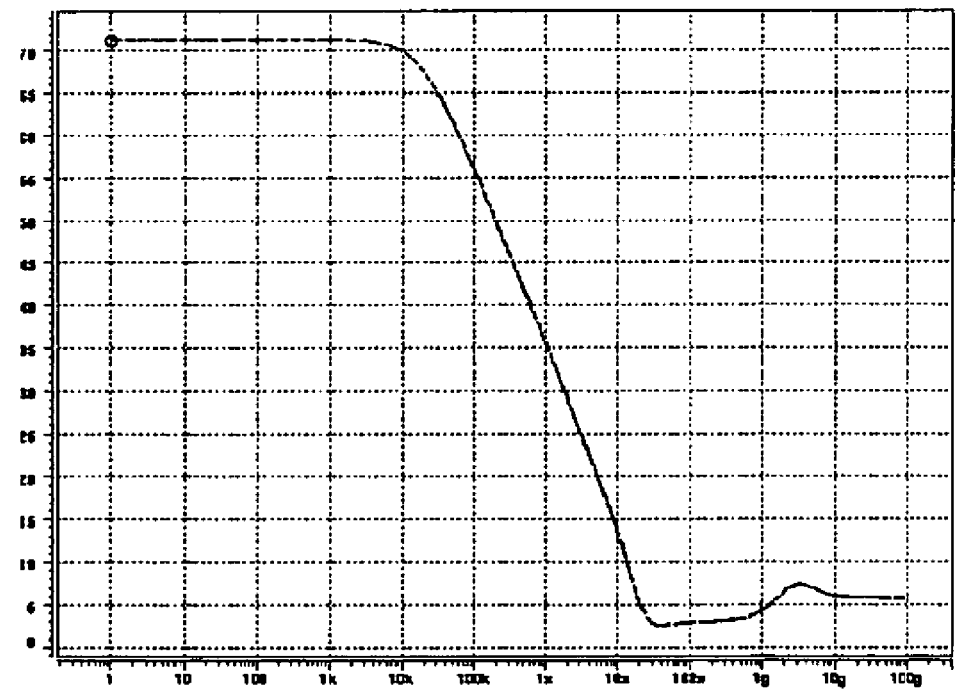
FIG. 4 shows a simulation result of PSRR in the LVDS driver with the high PSRR according to the invention.

FIG. 3 shows a simulation result of PSRR in the conventional LVDS driver, wherein the transverse coordinate represents the frequency of the power noise and the longitudinal coordinate represents the PSRR (db) of the common mode voltage level. FIG. 4 shows a simulation result of PSRR in the LVDS driver with the high PSRR according to the invention, wherein the transverse coordinate represents the frequency of the power noise and the longitudinal coordinate represents the PSRR (db) of the common mode voltage level. As shown in FIG. 3, when the frequency of the power noise is low, the PSRR of the common mode voltage level of the prior art LVDS driver is about 36 db, but the PSRR of the common mode voltage level of the LVDS driver of the invention may be increased to around 71 db. When the power noise frequency ranges from 10 to 100 MHz, the PSRR of the common mode voltage level of the typical LVDS driver may be as low as around 1 db, but the PSRR of the common mode voltage level of the LVDS driver of the invention may be increased to around 3 db. Thus, the simulation result can prove that the LVDS driver of the invention can increase the PSRR.

Figure 5:
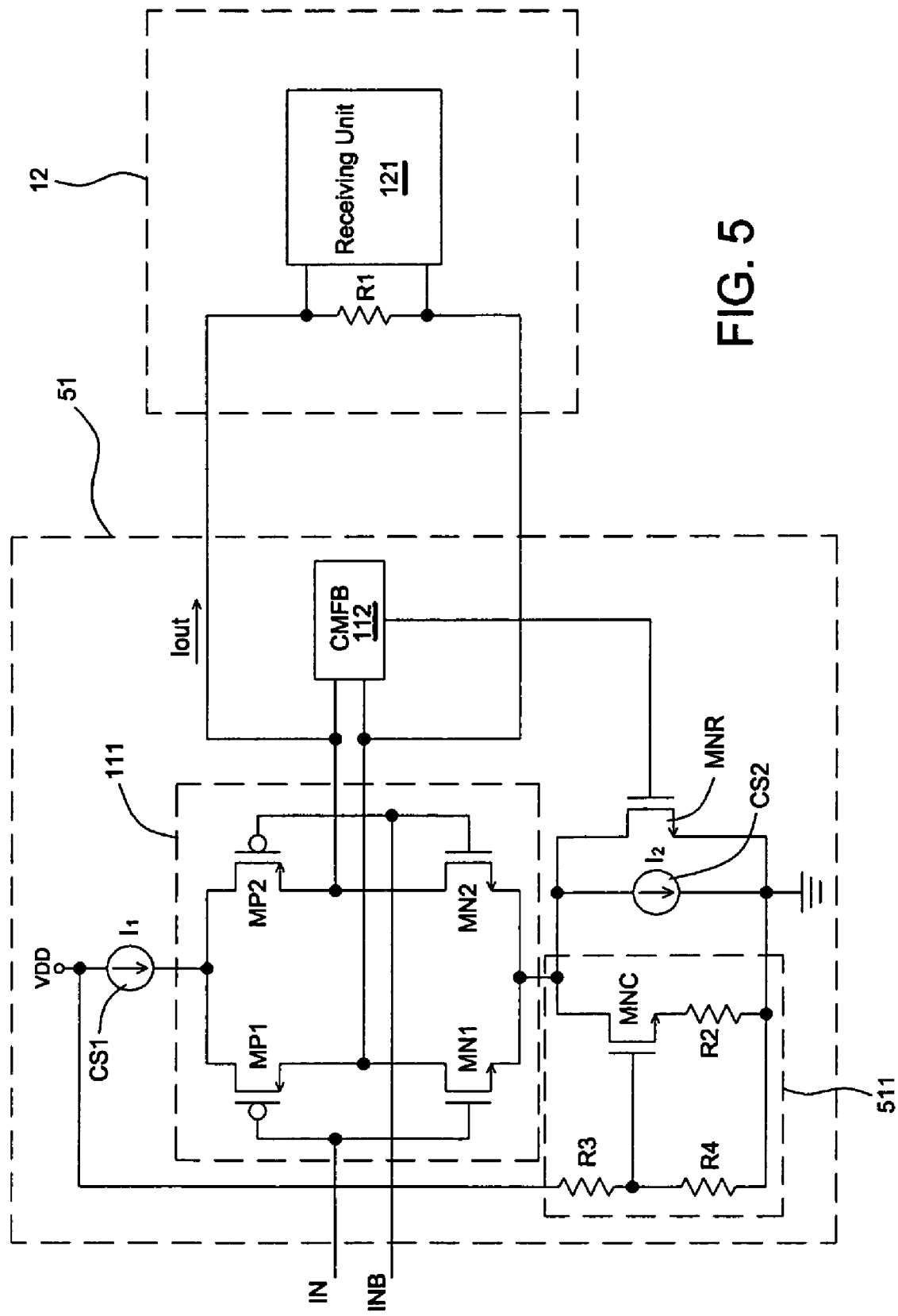
FIG. 5 shows the architecture of a LVDS driver with a high PSRR according to a second embodiment of the invention.

FIG. 5 shows the architecture of a LVDS driver with a high PSRR according to a second embodiment of the invention. As shown in FIG. 5, the LVDS driver 51 is almost the same as the LVDS driver 21 except that the gate voltage of the transistor MNC of a compensation unit 511 is generated by two resistors R3 and R4 connected in series, and the series connection of resistors R3 and R4 are coupled to the operation voltage VDD and the ground VSS. Thus, the current variation $\Delta Ic$ of the transistor MNC of the compensation unit 511 is influenced by the voltage variation $\Delta VDD$ of the operation voltage VDD and the $\Delta I_1$ of the current source CS1 caused by the power noise dynamically flows through the compensation unit 511. Thus, the $\Delta I_1$ caused by the power noise does not flow through the transistor MNR to influence the common mode level. The invention may be achieved as long as the resistance values of the resistors R3 and R4 can make the transistor MNC work in the saturation region.

While certain exemplary embodiments have been described and shown in the accompanying drawings, it is to be understood that such embodiments are merely illustrative of and not restrictive on the broad invention, and that this invention not be limited to the specific construction and arrangement shown and described, since various other modifications may occur to those ordinarily skilled in the art.

What is claimed is:

1. A LVDS (Low Voltage Differential Signal) driver with a high PSRR (Power Supply Rejection Ration), comprising:
   a first current source for providing a first working current;
   a switch unit having a first signal node and a second signal node for receiving the first working current and outputting output current at the first signal node and the second signal node, the current directions of the output current being controlled by a first input signal and a second input signal;
   a second current source couple to the switch unit and a low working power voltage;
   a common mode feedback unit for generating a common mode control signal according to voltages at the first signal node and the second signal node of the switch unit;
   a common mode resistance unit connected in parallel with the second current source and having a resistance value controlled by the common mode control signal; and
   a compensation unit, which is connected in parallel with the second current source, for compensating a current variation of the first current source caused by a power noise.

2. The LVDS driver according to claim 1, wherein the switch unit comprises:
   a first switch having an input terminal and an output terminal, which is controlled by the first input signal, the input terminal of the first switch being coupled to the first current source;
   a second switch having an input terminal and an output terminal, which is controlled by the first input signal, wherein the input terminal of the second switch is connected to the output terminal of the first switch to serve as the first signal node, and the second switch and the first switch operate reversely;
   a third switch having an input terminal and an output terminal, which is controlled by the second input signal, the input terminal of the third switch being coupled to the first current source; and a fourth switch having an input terminal and an output terminal, which is controlled by the second input signal, wherein the input terminal is connected to the output terminal of the third switch to serve as the second signal node, the fourth switch and the third switch operate reversely, and the output terminal of the fourth switch is connected to the output terminal of the second switch.

3. The LVDS driver according to claim 1, wherein the common mode resistance unit is a transistor having a gate for receiving the common mode control signal.

4. The LVDS driver according to claim 1, wherein the compensation unit comprises:
   a compensation transistor having a gate and a drain both coupled to a current input terminal of the second current source; and
   a compensation resistor having one terminal connected to a source of the compensation transistor and the other terminal connected to the low working power voltage.

5. The LVDS driver according to claim 1, wherein the compensation unit comprises:
   a serial voltage-dividing resistor, which has two terminals coupled to the high working power voltage and the low working power voltage, for providing a voltage-dividing signal;
   a compensation transistor having a gate for receiving the voltage-dividing signal, and a drain connected to a current input terminal of the second current source; and
   a compensation resistor having one terminal connected to a source of the compensation transistor and the other terminal coupled to the low working power voltage.

6. The LVDS driver according to claim 5, wherein the voltage-dividing signal generated by the serial voltage-dividing resistor enables the compensation transistor to work in a saturation region.

7. The LVDS driver according to claim 4, wherein when the high working power voltage is VDD, the first current source has a current variation $\Delta I_1$ defined as ($\Delta I_1 = \Delta VDD*K1$) relative to the high working power voltage VDD, and an input terminal voltage Va of the second current source has a variation $\Delta Va$ defined as ($\Delta Va = \Delta VDD*K2$) relative to the high working power voltage VDD, then a current variation $\Delta Ic$ is defined as ($\Delta Ic = \Delta Va*K3$) because the current variation $\Delta Ic$ of the compensation resistor is in direct proportion to $\Delta Va$, and the compensation unit substantially compensates the current variation of the first current source caused by the power noise as long as K1 equals (K2*K3), and K1, K2 and K3 are positive values.

8. The LVDS driver according to claim 5, wherein when the high working power voltage is VDD, the first current source has a current variation $\Delta I_1$ defined as ($\Delta I_1 = \Delta VDD*K1$) relative to the high working power voltage VDD, and an input terminal voltage Va of the second current source has a variation $\Delta Va$ defined as ($\Delta Va = \Delta VDD*K2$) relative to the high working power voltage VDD, then a current variation $\Delta Ic$ is defined as ($\Delta Ic = \Delta Va*K3$) because the current variation $\Delta Ic$ of the compensation resistor is in direct proportion to $\Delta Va$, and the compensation unit substantially compensates the current variation of the first current source caused by the power noise as long as K1 equals (K2*K3), and K1, K2 and K3 are positive values.

* * * * *